United States Patent
Ichikawa et al.

(10) Patent No.: US 6,793,850 B2
(45) Date of Patent: Sep. 21, 2004

(54) ALKALI DEVELOPMENT TYPE PHOTOCURABLE COMPOSITION AND CALCINED PATTERN OBTAINED BY USE OF THE SAME

(75) Inventors: Kyo Ichikawa, Tsurugashima (JP); Kouichi Takagi, Kawagoe (JP); Nobuyuki Suzuki, Sakado (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 301 days.

(21) Appl. No.: 10/042,201

(22) Filed: Jan. 11, 2002

(65) Prior Publication Data

US 2002/0096666 A1 Jul. 25, 2002

Related U.S. Application Data

(63) Continuation of application No. PCT/JP00/04495, filed on Jul. 6, 2000, now abandoned.

(30) Foreign Application Priority Data

Jul. 12, 1999 (JP) ............................................ 11-197791

(51) Int. Cl.$^7$ .......................... H01C 1/00; H01L 21/02; C08F 2/46; G03F 7/04
(52) U.S. Cl. ....................... 252/511; 252/500; 252/502; 252/503; 252/506; 252/507; 430/321; 430/326; 430/330; 524/403
(58) Field of Search ................................ 252/500, 502, 252/503, 506, 507, 511, 518.1; 430/321, 326, 330, 270.1, 280, 285.1; 524/403; 523/458

(56) References Cited

U.S. PATENT DOCUMENTS

| | | | | |
|---|---|---|---|---|
| 5,470,506 A | * | 11/1995 | Tanigami et al. | 252/520.22 |
| 5,741,622 A | * | 4/1998 | Arima | 430/270.1 |
| 5,973,034 A | | 10/1999 | Mori et al. | |
| 6,132,937 A | * | 10/2000 | Suzuki | 430/285.1 |
| 6,555,594 B1 | * | 4/2003 | Fukushima et al. | 522/81 |

FOREIGN PATENT DOCUMENTS

| | | | | |
|---|---|---|---|---|
| JP | 07248619 | | 9/1995 | |
| JP | 7-248619 | | 9/1995 | |
| JP | 07-248619 | * | 9/1995 | ........... G03F/7/022 |
| JP | 09218509 | | 8/1997 | |
| JP | 9-218509 | | 8/1997 | |
| JP | 9-316149 | | 12/1997 | |
| JP | 09316149 | | 12/1997 | |
| JP | 10-48815 | | 2/1998 | |
| JP | 10-87769 | | 4/1998 | |
| JP | 10087769 | | 4/1998 | |
| JP | 10-087769 | * | 4/1998 | ......... C08F/299/02 |
| JP | 10-273338 | | 10/1998 | |
| JP | 10273338 | | 10/1998 | |
| JP | 11-31416 | | 2/1999 | |
| JP | 11031416 | | 2/1999 | |

* cited by examiner

Primary Examiner—Mark Kopec
Assistant Examiner—Kallambella Vijayakumar
(74) Attorney, Agent, or Firm—Rader, Fishman & Grauer PLLC

(57) ABSTRACT

An alkali development type photocurable composition comprises (A) an alkali-soluble macromolecular binder having a weight-average molecular weight in the range of 5,000 to 100,000 and an acid value in the range of 50 to 150 mg KOH/g and obtained by causing (d) a compound possessing one glycidyl group in its molecule to react with a carboxyl group of (A-1) a copolymer of (a) an ethylenically unsaturated bond-containing compound possessing one carboxyl group in its molecule with (b) an ethylenically unsaturated bond-containing compound possessing neither hydroxyl group nor acidic group in its molecule, or a carboxyl group of (A-2) a copolymer of the compounds (a) and (b) mentioned above and (c) an ethylenically unsaturated bond-containing compound possessing a hydroxyl group and then causing (e) a polybasic acid anhydride to react with a hydroxyl group caused by the above reaction, (B) an inorganic powder, (C) a photopolymerizable monomer, (D) a photopolymerization initiator, and (E) an organic solvent. By using this composition, such calcined patterns as a conductor pattern and a dielectric pattern of high fineness may be formed by the photolithographic technique.

16 Claims, No Drawings

ALKALI DEVELOPMENT TYPE PHOTOCURABLE COMPOSITION AND CALCINED PATTERN OBTAINED BY USE OF THE SAME

CROSS-REFERENCE TO RELATED APPLICATIONS

This is a continuation of Application PCT/JP00/04495, filed Jul. 6, 2000, now abandoned.

BACKGROUND OF THE INVENTION

1. Field of the Invention

This invention relates to a photocurable composition which is developable with an aqueous alkaline solution and is applicable particularly advantageously to the formation of a conductor circuit pattern, a barrier rib pattern, a dielectric pattern, a fluorescent pattern, and a black matrix on the front and the back substrate of a plasma display panel (PDP), and applicable also to the formation of an electric conductor, a resister, and a dielectric element for use in a fluorescent display tube and electronic parts. This invention also relates to such calcined patterns as a conductor pattern, a vitreous dielectric pattern, and a fluorescent pattern which are obtained by the use of the photocurable composition.

2. Description of the Prior Art

In recent years, a front substrate and back substrate of a plasma display panel, an electrode circuit substrate of a printed circuit board, and the like have been witnessing steady advance of the patterns formed thereon toward higher fineness. In consequence of this trend, the desirability of improving the technique for the formation of such patterns has been finding growing approval. Particularly, the plasma display panels have been undergoing conspicuous technological innovations devoted to enlarging size and enhancing resolution. The manufacturers of plasma display panels have recently succeeded in commercializing such panels of the 50-inch class and have been continuing an effort to produce such panels in a larger size with higher resolution.

Heretofore, the conductor patterns and dielectric patterns in plasma display panels, fluorescent display tubes, electronic parts, etc. have been generally formed by the screen printing process which uses an electroconductive paste or a glass paste containing a very large amount of metal powder or glass powder. The formation of such patterns by the screen printing process, however, entails such problems as requiring skill on the part of workers, exposing the layer of fresh paint deposited by printing to the possibility of sustaining blurs or blots, degrading the accuracy of registration of printed patterns due to expansion and contraction of the screen, and jagging the formed pattern due to the contact with the screen mesh. Thus, the screen printing process produces required patterns only with a poor yield and incurs difficulty in coping with the trend of patterns toward higher fineness and the trend of plasma display panels toward enlargement of size. In the circumstances, the desirability of developing a pattern processing material which is capable of more stably coping with the demand for patterns of higher fineness and for panels of larger size has been finding recognition.

As a prospective alternative for the screen printing process, therefore, the photolithographic process has been proposed in published Japanese Patent Application, KOKAI (Early Publication) No. (hereinafter referred to briefly as "JP-A-") 1-296,534, JP-A-2-165,538, and JP-A-5-342,992, for example. The photolithographic process forms a pattern by applying an ultraviolet-curable glass paste to an insulating substrate and exposing and developing the coating of paste.

As to the development step in the photolithographic process, with due respect to the problem of environmental safety, the alkali development type has come to play the leading role. A macromolecular compound containing carboxyl groups is generally used as a film-forming component for the purpose of modifying a given composition to the alkali development type.

When the macromolecular compound containing carboxyl groups is made to incorporate such a fine basic inorganic powder as glass frit, however, the paste consequently obtained acquires too inferior viscosity stability to fit practical use. Specifically, the glass paste composition of such inferior viscosity stability entails deterioration of the operational efficiency of coating work and degradation of the developing properties of the applied coating in consequence of such phenomena as gelation and decline of flowability and consequently brings the problem of affording no sufficient allowance in work.

SUMMARY OF THE INVENTION

A primary object of the present invention, therefore, is to provide an alkali development type photocurable composition which is excellent in storage stability (viscosity stability), operational efficiency of coating work, and developability with an aqueous alkaline solution notwithstanding an extremely large content of a fine inorganic powder and, at the same time, capable of forming a pattern of high fineness and high aspect ratio without giving rise to curls (warps) or peeling along the pattern edges during the course of calcining.

A further object of the present invention is to provide an alkali development type photocurable composition which enjoys an excellent calcining properties, permits use of a relatively low temperature for the purpose of calcining, and exhibits stable fastness of adhesion to a substrate invariably at the steps of drying, exposure to light, development, and calcining.

A more concrete object of the present invention is to provide an alkali development type photocurable composition which permits formation of a conductor circuit pattern, a vitreous dielectric pattern, or a fluorescent pattern of high fineness with satisfactory workability and high productivity by the photolithographic technique, and undergoes a calcining step at a temperature of not more than 600° C. infallibly without giving rise to a calcining residue capable of exerting an adverse effect on an image.

Another object of the present invention is to provide a calcined pattern of high fineness manufactured with high productivity from the photocurable composition mentioned above through a series of selective exposure to light, development, and calcining and a technique for the manufacture.

To accomplish the objects mentioned above, the first aspect of the present invention resides in providing an alkali development type photocurable composition, which composition is characterized by comprising (A) an alkali-soluble macromolecular binder having a weight-average molecular weight in the range of 5,000 to 100,000 and an acid value in the range of 50 to 150 mg KOH/g, possessing no ethylenically unsaturated double bond, and obtained by causing (d) a compound possessing one glycidyl group and no ethylenically unsaturated double bond in its molecule to react with a carboxyl group of (A-1) a copolymer of (a) an ethylenically unsaturated bond-containing compound possessing one carboxyl group in its molecule with (b) an ethylenically unsaturated bond-containing compound possessing neither hydroxyl group nor acidic group in its molecule, the copolymer possessing no glycidyl group, or with a carboxyl group of (A-2) a copolymer of (a) an ethylenically unsaturated bond-containing compound possessing one carboxyl group in its molecule with (b) an ethylenically unsaturated bond-containing compound possessing neither hydroxyl group nor acidic group in its molecule and (c) an ethylenically unsaturated bond-containing compound possessing a hydroxyl group, the copolymer possessing no glycidyl group, and then causing (e) a polybasic acid anhydride to react with a secondary hydroxyl group caused by the above reaction and a primary hydroxyl group of the copolymer (A-2) mentioned above, (B) an inorganic powder, (C) a photopolymerizable monomer, (D) a photopolymerization initiator, and (E) an organic solvent. Preferably, the inorganic powder (B) mentioned above contains a low melting glass frit account for a portion of not less than 5% by weight thereof.

The photocurable composition of the present invention may be in the form of paste or in the form of a dry film produced in advance from the composition in the form a film.

In the case of the pasty form, a photocurable and electroconductive past composition is produced by using a fine electroconductive powder as the inorganic powder (B) and a photocurable glass paste composition is produced by exclusively using glass powder as the inorganic powder (B). The paste composition for use in the formation of the black pattern additionally contains a black pigment.

The inorganic powder mentioned above is advantageously used when it has an average particle diameter of not more than 10 microns.

As the fine electroconductive powder which is effectively used for the photocurable and electroconductive paste, any powder of an electroconductive metal such as ruthenium, gold, silver, copper, palladium, platinum, aluminum, and nickel and other black fine electroconductive powders may be used. In the case of the photocurable glass paste, a low melting glass having a softening point in the range of 300° to 600° C. may be advantageously used.

As the black pigment, those mainly formed of a metal oxide containing as a main component thereof one or more metals selected from among Fe, Co, Cu, Cr, Mn, and Al may be advantageously used.

Since the contact of the carboxyl groups of an alkali-soluble macromolecular binder with fine basic inorganic particles are repressed owing to the steric hindrance between the main chain and the side chain of the binder, the alkali development type photocurable composition of the present invention, though developable with an aqueous alkaline solution, excels in viscosity stability (storage stability) and avoids bringing such problems as deteriorating the operational efficiency of coating work due to gelation or decline of flowability of the composition or degrading the pattern-forming properties due to decline of the developing properties. Further, when the photocurable composition contains such an alkali-soluble macromolecular binder in combination with a stabilizer, it exhibits excellent storage stability even if it contains a large amount of the inorganic powder.

Another aspect of the present invention resides in providing a calcined pattern formed of the photocurable composition described above. When the photocurable composition is in the form of paste, for example, the pasty photocurable composition is applied to a substrate and then dried to form a film. When the photocurable composition is in the form of a dry film, the dry film is laminated on the substrate. A calcined pattern of high fineness is obtained by patterning the superposed layer of the composition by selective exposure to light and development, and thereafter calcining the patterned film.

The calcined pattern which is formed as described above serves as an electroconductive pattern when a fine metallic powder is used as the inorganic powder (B) mentioned above or a vitreous dielectric pattern when a glass powder is used instead. Optionally, a fluorescent pattern may be formed by using a fluorescent powder as the inorganic powder.

The use of the photocurable composition of the present invention, therefore, enables such calcined patterns of high fineness as conductor pattern, vitreous dielectric pattern, and fluorescent pattern to be stably formed with high yield and satisfactory productivity on a substrate of a large surface area by the technique of photolithography without entailing such problems as deteriorating the working environment.

DETAILED DESCRIPTION OF THE INVENTION

The conventional alkali development type photocurable paste composition possesses very poor storage stability (viscosity stability) and entails deterioration of the operational efficiency of coating work and degradation of the developing properties of the applied coating in consequence of such phenomena as gelation and decline of flowability of the composition as described above and consequently brings the problem of compelling the operating conditions to be set in a very narrow range.

The present inventors, therefore, have tried addition of an organic acid or an inorganic acid to the alkali development type photocurable paste composition for the purpose of repressing the reaction of fine basic inorganic particles with carboxyl groups. However, it has only been discovered that this measure, though capable of repressing the phenomenon of gelation of the composition, brings such disadvantages as degrading the dryness to touch of the applied coating after drying, subsequently exhibiting inferior working properties, and suffering occurrence of pin holes in the drawn pattern and chippings in the pattern lines.

The present inventors, after further continuing a diligent study with a view to solving these problems, have discovered that a photocurable paste composition exhibiting excellent storage stability is obtained by endowing the carboxyl groups of an alkali-soluble macromolecular binder with steric hindrance thereby repressing the contact of the carboxyl groups with fine basic inorganic particles.

Specifically, the photocurable composition of the present invention is characterized by using, as a binder for an inorganic powder, (A) an alkali-soluble macromolecular binder having a weight-average molecular weight in the range of 5,000 to 100,000 and an acid value in the range of 50 to 150 mg KOH/g, possessing no ethylenically unsaturated double bond, and obtained by causing (d) a compound possessing one glycidyl group and no ethylenically unsaturated double bond in its molecule to react with a carboxyl group of (A-1) a copolymer of (a) an ethylenically unsaturated bond-containing compound possessing one carboxyl group in its molecule with (b) an ethylenically unsaturated bond-containing compound possessing neither hydroxyl group nor acidic group in its molecule, the copolymer possessing no glycidyl group, or with a carboxyl group of (A-2) a copolymer of (a) an ethylenically unsaturated bond-containing compound possessing one carboxyl group in its molecule with (b) an ethylenically unsaturated bond-containing compound possessing neither hydroxyl group nor acidic group in its molecule and (c) an ethylenically unsaturated bond-containing compound possessing a hydroxyl group, the copolymer possessing no glycidyl group, and then causing (e) a polybasic acid anhydride to react with a secondary hydroxyl group caused by the above reaction and a primary hydroxyl group of the copolymer (A-2) mentioned above.

This macromolecular binder (A) contains carboxyl groups in the side chains thereof, it is soluble in an aqueous alkaline solution. The film which is formed of the photocurable composition of the present invention, therefore, can be stably developed with an aqueous alkaline solution after selective exposure to light.

Since the carboxyl groups in the side chain mentioned above include those introduced by causing the compound (d) possessing one glycidyl group in its molecule to react with the carboxyl group of the copolymer mentioned above and further by the addition reaction of the polybasic acid anhydride to the secondary hydroxyl group caused by the above reaction and positioned near the main chain and the carboxyl group is linked to a site of the side chain approximating closely to the main chain, the macromolecular binder is precluded from contacting the fine basic inorganic particles owing to the steric hindrance between the main chain and the side chain. As a result, the composition which contains such an alkali-soluble macromolecular binder as mentioned above in conjunction with the fine inorganic particles, therefore, exhibits outstanding storage stability and very rarely incurs alteration of viscosity or induces gelation during the course of storage.

Further, when the macromolecular binder (A) is used in combination with a stabilizer (F), it is possible to obtain a photosensitive composition which exhibits more excellent storage stability. This is because the reaction of the pendant carboxyl groups to the basic inorganic powder is more suppressed when used as the stabilizer (F) such an acid as an inorganic acid, an organic acid, and a phosphoric acid compound having acidity stronger than the pendant carboxyl group of the macromolecular binder (A). As a result, the composition containing such an alkali-soluble macromolecular binder as mentioned above in conjunction with the inorganic powder exhibits more excellent storage stability when the stabilizer is added to the composition.

When the photocurable composition of the present invention is intended to form glass paste, a low melting glass powder is used as the inorganic powder (B) mentioned above. Even when such other inorganic powder as metal powder is used for forming electroconductive paste, the incorporation of the low melting glass powder in an amount of not less than 5% by weight proves advantageous. The presence of the low melting glass powder enables the composition to be calcined at a temperature of not more than 600° C. and enhances the fastness of adhesion of the calcined pattern to a substrate.

As a result, the photocurable composition of the present invention permits a pattern of high fineness to be easily formed on a substrate of a large surface area by the photolithographic technique without entailing such problems as suffering degradation of stability of storage and impairment of the operational efficiency of coating work owing to the gelation or the decline of flowability of the composition, fully allows the calcining step performed at a temperature of not more than 600° C., and realizes a marked improvement of the yield.

Now, the components of the photocurable composition of the present invention will be described in detail below.

As one monomer component of the backbone polymer of the alkali-soluble macromolecular binder (A) for use in the present invention, an ethylenically unsaturated bond-containing compound possessing one carboxyl group in its molecule (a) is used. As concrete examples of such compounds, acrylic acid, methacrylic acid, crotonic acid, or vinylacetic acid; and the reaction product of such an acid hydride as maleic anhydride, itaconic anhydride, or pyromellitic anhydride with such a hydroxyl group-containing unsaturated compound as 2-hydroxyethyl (meth)acrylate or 2-hydroxypropyl (meth)acrylate, and other similar hydroxyalkyl (meth)acrylates may be cited. These compounds may be used either singly or in the form of a combination of two or more members. Among other compounds mentioned above, acrylic acid and/or methacrylic acid (hereinafter referred to as (meth)acrylic acid when collectively referred to) are advantageously used. Incidentally, the term "(meth) acrylate" as used in the present specification refers collectively to acrylate and methacrylate.

As concrete examples of the aforementioned ethylenically unsaturated bond-containing compound possessing neither hydroxyl group nor acidic group in its molecule (b), styrene, chlorostyrene, and α-methylstyrene; (meth)acrylates possessing methyl, ethyl, n-propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl as substituent(s); mono(meth) acrylates of polyethylene glycol and mono(meth)acrylates of polypropylene glycol; vinyl acetate, vinyl butyrate, and vinyl benzoate; and acrylamide, methacrylamide, N-hydroxymethyl acrylamide, N-hydroxymethyl methacrylamide, N-methoxymethyl acrylamide, N-ethoxymethyl acrylamide, N-butoxymethyl acrylamide, acrylonitrile, vinyl ethers, and isobutylene may be cited. These compounds may be used either singly or in the form of a combination of two or more members. Among other compounds mentioned above, styrene, α-methylstyrene, lower alkyl (meth)acrylates, and isobutylene are advantageously used. In terms of the pyrolysis of the resin, methyl (meth)acrylate is particularly advantageously used.

As concrete examples of the aforementioned ethylenically unsaturated bond-containing compound possessing a hydroxyl group (c), 2-hydroxyethyl methacrylate, 2-hydroxypropyl methacrylate, 2-hydroxyethyl acrylate, and 2-hydroxypropyl acrylate may be cited. These compounds may be used either singly or in the form of a combination of two or more members. Among other compounds mentioned above, 2-hydroxyethyl methacrylate is advantageously used.

The copolymerization reaction of the aforementioned ethylenically unsaturated bond-containing compound possessing one carboxyl group in its molecule (a) with the ethylenically unsaturated bond-containing compound possessing neither hydroxyl group nor acidic group in its molecule (b) or the copolymerization reaction of the aforementioned ethylenically unsaturated bond-containing compound possessing one carboxyl group in its molecule (a) with the ethylenically unsaturated bond-containing compound possessing neither hydroxyl group nor acidic group in its molecule (b) and the ethylenically unsaturated bond-containing compound possessing a hydroxyl group (c) easily proceeds in the presence of a radical polymerization catalyst such as azobisisobutyronitrile or organic peroxides. It can be carried out as by the standard method of solution polymerization at a temperature in the approximate range of 40° to 130° C., thereby giving rise to a random copolymer.

As concrete examples of the aforementioned compound possessing one glycidyl group and no ethylenically unsaturated double bond in its molecule (d), methyl glycidyl ether, buthyl glycidyl ether, 2-ethylhexyl glycidyl ether, phenyl glycidyl ether, and glycidol may be cited.

The addition reaction of the aforementioned glycidyl group-containing compound (d) to the side chain (carboxyl group) of the copolymer and the esterification reaction of the saturated or unsaturated polybasic acid anhydride (e) to the secondary hydroxyl group produced by the above addition reaction and the primary hydroxyl group of the copolymer (A-2) mentioned above are preferred to use a catalyst capable of promoting the reaction. As concrete examples of the catalyst to be advantageously used herein, triethylamine, benzyldimethylamine, methyltriethylammonium chloride, tetrabutylammonium bromide, benzyltrimethylammonium bromide, benzyltrimethylammonium iodide, triphenylphosphine, triphenylstibine, chromium octanoate, and zirconium octanoate may be cited. Preferably, the amount of such a catalyst to be used is in the range of 0.1 to 10% by weight of the reaction mixture. The temperatures of the addition reaction and the esterification reaction mentioned above are preferred to be in the range of 60° to 120° C. Incidentally, the ratio of the reaction of the polybasic acid anhydride (e) to the secondary hydroxyl group caused by the aforementioned addition reaction and the primary hydroxyl group of the copolymer (A-2) mentioned above is preferred to be adjusted such that the acid value of the carboxyl group-containing polymer to be produced as described above may fall in the range of 50 to 150 mg KOH/g.

As concrete examples of the aforementioned polybasic acid anhydride (e) to be used in the esterification reaction, maleic anhydride, succinic anhydride, phthalic anhydride, tetrahydrophthalic anhydride, hexahydrophthalic anhydride, methyltetrahydrophthalic anhydride, methylhexahydrophthalic anhydride, methylendomethylenetetrahydrophthalic anhydride, endomethylenetetrahydrophthalic anhydride, chlorendic anhydride, and trimellitic anhydride may be cited. These polybasic acid anhydrides may be used either singly or in the form of a combination of two or more members.

The alkali-soluble macromolecular binder (A) containing the components mentioned above can be used advantageously when the weight-average molecular weight thereof falls in the range of 5,000 to 100,000, preferably 6,000 to 30,000, and the acid value thereof falls in the range of 50 to 150 mg KOH/g, preferably 60 to 100 mg KOH/g. If the molecular weight of the macromolecular binder (A) is less than 5,000, the binder will bring an adverse effect on the fastness of adhesion of the coating layer to a substrate during the course of development. Conversely, if the molecular weight exceeds 100,000, the binder will tend to impair the operation of development. If the acid value of the binder is less than 50 mg KOH/g, the solubility of the binder in an aqueous alkaline solution will be insufficient and the development of the coating layer after exposure to light will tend to prove defective. Conversely, if the acid value exceeds 150 mg KOH/g, the fastness of adhesion of the coating layer will be degraded and the photo-cured part (exposed part) will tend to produce dissolution during the course of development.

Preferably the alkali-soluble macromolecular binder (A) described above is incorporated into the composition in a proportion in the range of 5 to 50% by weight, based on the total weight of the composition. If the amount of the macromolecular binder to be incorporated accounts for a proportion smaller than the lower limit of the range mentioned above, the distribution of the resin mentioned above in the formed coating will tend to become ununiform and the formation of a pattern of high fineness by the selective exposure to light and development will become difficult. Conversely, if the amount is larger than the upper limit of the range, the excess will bring such disadvantages as deflecting the pattern or causing contraction of line width during the course of calcining.

As concrete examples of the inorganic powder (B) to be used in formulating the photocurable composition of the present invention as an electroconductive paste, fine metal particles (B-1) or electroconductive fine black particles (B-2), or mixtures of such fine electroconductive particles with fine glass particles (B-3) may be cited.

Examples of the fine metal particles (B-1) include gold, silver, copper, ruthenium, palladium, platinum, aluminum, nickel, and alloys thereof, for example. The metal particles mentioned above may be used either singly or in the form of a combination of two or more members. From the viewpoint of resolution, the metal particles are preferred to have an average particle diameter of not more than 10 $\mu$m, preferably not more than 5 $\mu$m. These metal particles in the form of spheres, blocks, flakes, and dendrites may be used either singly or in the form of a combination of two or more members. In order for these metal particles to be prevented from oxidation, improved in dispersibility in the composition, and allowed to acquire a stabilized developing properties, particularly particles of Ag, Ni, or Al are preferred to be treated with a fatty acid. As concrete examples of the fatty acid which is usable for this treatment, oleic acid, linolic acid, linolenic acid, and stearic acid may be cited.

The electroconductive fine black particles (B-2) should have the stability in a color tone and electroconductivity at a high temperature because the high-temperature calcination at 500–600° C. is performed in the electrode formation step of the PDP. Ruthenium oxides, ruthenium compounds, copper-chromium system black composite oxides, and copper-iron system black composite oxides, for example, may be advantageously used. Ruthenium oxides and ruthenium compounds are particularly suitable in terms of their excellent stability in a color tone and electroconductivity at a high temperature.

Properly, the amount of such electroconductive fine particles to be incorporated is in the range of 25 to 1,000 parts by weight, based on 100 parts by weight of the aforementioned alkali-soluble macromolecular binder (A). If the amount of the electroconductive fine particles to be incorporated is smaller than the lower limit of the above range, the shortage will tend to cause contraction of line width of the conductor circuit or breakage of the line. Conversely, if the amount exceeds the upper limit of the above range, the excess will impair the permeation of light and render the impartation of sufficient photo-curing properties to the composition difficult.

For the purpose of enabling the film formed after calcining to acquire enhanced strength and exhibit improved fastness of adhesion to the substrate, a glass powder (B-3) which will be specifically described hereinbelow may be additionally incorporated in an amount in the range of 5 to 30 parts by weight, based on 100 parts by weight of the electroconductive powder.

A low melting glass frit having a softening point in the range of 300° to 600° C. is used as the glass powder (B-3)

which is needed when the photocurable composition of the present invention is formulated as glass paste. The species of low melting glass frit which use lead oxide, bismuth oxide, zinc oxide, or lithium oxide as a main component are advantageously adopted herein. The low melting glass frit which is used favorably herein has a glass transition point in the range of 300° to 550° C. and a thermal expansion coefficient, $\alpha_{300}$, in the range of 70–90 ×10$^{-7}$/° C. From the viewpoint of resolution, the glass frit has an average particle diameter of not more than 10 μm, preferably not more than 2.5 μm.

Properly, the amount of the glass powder to be incorporated is in the range of 25 to 1,000 parts by weight, based on 100 parts by weight of the alkali-soluble macromolecular binder (A) mentioned above.

One preferable example of the glass powder containing lead oxide as the main component thereof is an amorphous frit which is composed of (in percent by weight of oxide basis) 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C.

One preferable example of the glass powder containing bismuth oxide as the main component thereof is an amorphous frit which is composed of (in percent by weight of oxide basis) 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C.

One preferable example of the glass powder containing zinc oxide is an amorphous frit which is composed of (in percent by weight of oxide basis) 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and has a softening point in the range of 420–590° C.

One preferable example of the glass powder containing lithium oxide as the main component thereof is an amorphous frit which is composed of (in percent by weight of oxide basis) 1–13% of $Li_2O$, 0–30% of $Bi_2O_3$, 1–50% of $B_2O_3$, 1–50% of $SiO_2$, 1–40% of $Al_2O_3$, 1–20% of BaO, and 1–25% of ZnO and has a softening point in the range of 420–590° C.

When the paste requires to have a black color tone, it may incorporate therein a black pigment formed of a metal oxide or a complex metal oxide containing one or more metals selected from among Fe, Co, Cu, Cr, Mn, and Al as main components thereof. From the viewpoint of the degree of blackness, the preferred black pigment has an average particle diameter of not more than 1.0 μm, preferably not more than 0.6 μm.

As the inorganic powder (B-4) which is used when the photocurable composition of the present invention is formulated as fluorescent paste, various fluorescent powder may be used, depending on the purpose of application. For example, a long-afterglow fluorescent substance possessed of a sort of ceramic structure and obtained by mixing the oxide of at least one metallic element selected from the elements belonging to Groups IIa, IIIa, and IIIb in the Periodic Table of the Elements such as, for example, calcium oxide, strontium oxide, barium oxide, alumina, or cerium oxide with at least one rare earth element selected from among Sc, Y, La, Ce, Pr, Nd, Sm, Eu, Gd, Tb, Dy, Ho, Er, Tm, Yb, and Lu as an activating agent or coactivating agent and sintering the resultant mixture and a fluorescent substance formed of a sulfide of zinc or an alkali earth as a typical phosphorescent material may be used. Generally, $(Y,Gd)BO_3$:Eu (borates of yttrium and gadolinium having europium as a fluorescent center; emitting a red color), $Zn_2SiO_4$:Mn (zinc silicate having manganese as a fluorescent center, emitting a green color), $BaO.6Al_2O_3$:Mn (emitting a green color), $BaMgAl_{14}O_{23}$:Eu (barium magnesium aluminate having europium as a fluorescent center, emitting a blue color), and $BaMgAl_{10}O_{17}$:Eu (emitting a blue color) are used for the fluorescent layer of a plasma display panel. Properly, such a fluorescent powder has an average particle diameter of not more than 10 microns, preferably not more than 5 microns. The amount of the fluorescent powder to be incorporated is the same as the metal powder mentioned above.

A fine ceramic powder may be cited as another fine inorganic powder (B-5) which can be incorporated in the photocurable composition of the present invention. As the ceramic substance for this fine ceramic powder, it is proper to use one or more compounds selected from among alumina, cordierite, and zircon. From the standpoint of the degree of resolution, the ceramic powder properly has an average particle diameter of not more than 10 μm, preferably not more than 2.5 μm.

Since the inorganic powder having an average particle diameter of not more than 10 microns is advantageously used in the present invention, it is preferred for the purpose of preventing secondary agglomeration and improving dispersibility in the composition to have undergone a preliminary surface treatment with an organic acid, an inorganic acid, a silane coupling agent, a titanate-based coupling agent, or an aluminum-based coupling agent to an extent not so large as to impair the quality of the inorganic powder or to have incorporated therein the treating agent mentioned above at the time the photocurable composition is converted into a paste. The method for treating the inorganic powder is preferred to comprise the steps of dissolving such a surface-treating agent as mentioned above in an organic solvent or water, stirring the resultant solution with the inorganic powder added thereto, distilling the produced blend thereby expelling the solvent by distillation, and heat-treating the residue of the distillation at a temperature in the approximate range of 50° to 200° C. for a period of not less than two hours.

Examples of the photopolymerizable monomers (C) include, but are not limited to: diethylene glycol diacrylate, triethylene glycol diacrylate, polyethylene glycol diacrylate, nonanediol diacrylate, polyurethane diacrylate, trimethylolpropane triacrylate, pentaerythritol triacrylate, pentaerythritol tetraacrylate, ethylene oxide-modified trimethylolpropane triacrylate, dipentaerythritol pentaacrylate, dipentaerythritol tetraacrylate; methacrylates corresponding to the acrylates enumerated above; mono-, di-, tri-, and higher polyesters of polybasic acids with hydroxyalkyl (meth)acrylates; and mono-, di-, tri-, and higher polyesters of polybasic acids with hydroxyl group-containing polyvalent (meth)acrylate monomers. These photopolymerizable monomers may be used either singly or in the form of a combination of two or more members.

The amount of the photopolymerizable monomer (C) mentioned above to be incorporated in the composition is generally proper in the range of 1 to 200 parts by weight, preferably in the range of 20 to 100 parts by weight, based on 100 parts by weight of the alkali-soluble macromolecular binder (A) mentioned above from the viewpoint of promoting the photo-curing of the composition.

Examples of the photopolymerization initiators (D) mentioned above include, but are not limited to: benzoin and alkyl ethers thereof such as benzoin, benzoin methyl ether, benzoin ethyl ether, and benzoin isopropyl ether; acetophenones such as acetophenone, 2,2-dimethoxy-2-phenyl acetophenone, 2,2-diethoxy-2-phenyl acetophenone, and 1,1-dichloroacetophenone; aminoacetophenones such as 2-methyl-1-[4-(methylthio)phenyl]-2-morpholinopropan-1-one and 2-benzyl-2-dimethylamino-1-(4-morpholinophenyl)-butan-1-one; anthraquinones such as 2-methylanthraquinone, 2-ethylanthraquinone, 2-t-butyl-anthraquinone, 1-chloroanthraquinone, and 2-amylanthraquinone; thioxanthones such as 2,4-dimethylthioxanthone, 2,4-diethylthioxanthone, 2-chlorothioxanthone, and 2,4-diisopropylthioxanthone; ketals such as acetophenone dimethyl ketal and benzyl dimethyl ketal; benzophenones such as benzophenone; xanthones; phosphine oxides such as (2,6-dimethoxybenzoyl)-2,4,4-pentyl phosphine oxide, bis(2,4,6-trimethylbenzoyl)-phenyl phosphine oxide, and ethyl-2,4,6-trimethylbenzoyl-phenyl phosphinate; various peroxides; and 1,7-bis(9-acridinyl)heptane. These well known and widely used photopolymerization initiators may be used either singly or in the form of a combination of two or more members. The ratio of incorporation of the photopolymerization initiator (D) is preferred to be in the range of 1 to 20 parts by weight, based on 100 parts by weight of the alkali-soluble macromolecular binder (A).

Optionally such a photopolymerization initiator (D) may be used in combination with one or more photosensitizers such as tertiary amines like N,N-(dimethylamino)ethyl benzoate, N,N-(dimethylamino)isoamyl benzoate, pentyl-4-dimethylamino benzoate, triethylamine, and triethanolamine.

Where the photo-curing depth is required to be greater, such a titanothene type photopolymerization initiator as the product of Ciba Specialty Chemicals K.K. (sold under the product code of "CGI784") which initiates radical polymerization in a visible region, 3-substituted coumarin dyestuff, and a leuco-dye may be optionally used as a curing aid in combination with the above photopolymerization initiator.

An organic solvent (E) is used for the purpose of diluting the photocurable composition into a pasty constitution capable of easy application to a substrate and enabling the applied layer of the paste to form on drying a film capable of contact exposure. Examples of the organic solvents include, but are not limited to: ketones such as methyl ethyl ketone and cyclohexanone; aromatic hydrocarbons such as toluene, xylene, and tetramethyl benzene; glycol ethers such as cellosolve, methyl cellosolve, carbitol, methyl carbitol, butyl carbitol, propylene glycol monomethyl ether, dipropylene glycol monomethyl ether, dipropylene glycol mono-ethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethylether acetate; aliphatic hydrocarbons such as octane and decane; and petroleum solvents such as petroleum ether, petroleum naphtha, hydrogenated petroleum naphtha, and solvent naphtha. These well known and widely used organic solvents may be used either singly or in the form of a combination of two or more members.

The organic solvent may be used in an amount capable of adjusting the viscosity of the photocurable composition to a desired level depending on the kind of method adopted for the application of the photocurable composition.

The photocurable composition according to the present invention, for the purpose of improving the storage stability of the composition, may incorporate therein a compound which is capable of forming a complex or a salt in conjunction with a metal or oxide powder, as the stabilizer (F).

Such acids as inorganic acids, organic acids, and phosphoric acid compounds (inorganic phosphoric acid and organic phosphoric acid) can be advantageously used as the stabilizer (F). Such a stabilizer is preferred to be incorporated in an amount of not more than 5 parts by weight, based on 100 parts by weight of the inorganic powder (B).

As concrete examples of the inorganic acid, nitric acid, sulfuric acid, hydrochloric acid, and boric acid may be cited.

As concrete examples of the organic acid, formic acid, acetic acid, acetoacetic acid, citric acid, isocitric acid, anisic acid, propionic acid, butyric acid, isobutyric acid, valeric acid, isovaleric acid, azelaic acid, caproic acid, isocaproic acid, enanthic acid, caprylic acid, pelargonic acid, undecanoic acid, laurylic acid, tridecanoic acid, myristic acid, palmitic acid, stearic acid, arachic acid, behenic acid, oxalic acid, malonic acid, ethylmalonic acid, succinic acid, glutaric acid, adipic acid, pimelic acid, pyruvic acid, piperonic acid, pyromellitic acid, suberic acid, azelaic acid, sebacic acid, maleic acid, fumaric acid, phthalic acid, isophthalic acid, terephthalic acid, tartaric acid, levulinic acid, lactic acid, benzoic acid, isopropylbenzoic acid, salicylic acid, isocaproic acid, crotonic acid, isocrotonic acid, acrylic acid, methacrylic acid, tiglic acid, ethylacrylic acid, ethylidene propionic acid, dimethylacrylic acid, citronellic acid, undeceneic acid, undecanoic acid, oleic acid, elaidic acid, erucic acid, brassidic acid, phenylacetic acid, cinnamic acid, methylcinnamic acid, naphthoeic acid, abietic acid, acetylene dicarboxylic acid, atrolactinic acid, itaconic acid, crotonic acid, sorbic acid, vanillic acid, palmitic acid, hydroxycinnamic acid, hydroxynaphtheic acid, hydroxybutyric acid, biphenyl dicarboxylic acid, phenylcinnamic acid, phenylacetic acid, phenylpropionic acid, phenoxyacetic acid, propionic acid, hexanic acid, heptanoic acid, veratric acid, benzilic acid, oxalosuccinic acid, oxaloacetic acid, octanoic acid, gallic acid, mandellic acid, messaconic acid, methylmaroic acid, mellitic acid, lauric acid, ricinoleic acid, linoleic acid, and malic acid may be cited.

As concrete examples of the inorganic phosphoric acid, phosphoric acid, phosphorous acid, hypophosphorous acid, orthophosphoric acid, diphoshoric acid, tripolyphospshoric acid, and phosphonic acid may be cited.

As concrete examples of the organic phosphoric acid, methyl phosphate, ethyl phosphate, propyl phosphate, butyl phosphate, phenyl phosphate, dimethyl phosphate, diethyl phosphate, dibutyl phosphate, dipropyl phosphate, diphenyl phosphate, isopropyl phosphate, diisopropyl phosphate, n-butyl phosphate, methyl phosphite, ethyl phosphite, propyl phosphite, butyl phosphite, phenyl phosphite, dimethyl phosphite, diethyl phosphite, dibutyl phosphite, dipropyl phosphite, diphenyl phosphite, isopropyl phosphite, diisopropyl phosphite, n-butyl-2-ethylhexyl phosphite, hydroxyethylene diphosphonic acid, adenosine triphosphoric acid, adenosin phosphoric acid, mono(2-methacryloyloxyethyl) acid phosphate, mono(2-acryloyloxyethyl) acid phosphate, di(2-methacryloyloxyethyl) acid phosphate, di(2-acryloyloxyethyl) acid phosphate, ethyldiethylphosphonoacetate, ethyl acid phosphate, butyl acid phosphate, butylpyrophosphate, butoxyethyl acid phosphate, 2-ethylhexyl acid phosphate, oleyl acid phosphate, tetracosyl acid phosphate, diethylene glycol acid phosphate, and (2-hydroxyethyl)methacrylate acid phosphate may be cited.

As other acids, such sulfonic acids as benzenesulfonic acid, toluenesulfonic acid, naphthalenesulfonic acid, ethane sulfonic acid, naphtholsulfonic acid, taurine, methanillic acid, sulfanilic acid, naphthylaminesulfonic acid, sulfobenzoic acid, and sulfamic acid are also usable.

The stabilizers enumerated above may be used either singly or in the form of a combination of two or more members.

The photocurable composition of the present invention may further incorporate therein, as occasion demands, such other additives as various pigments, particularly heat-resistant inorganic pigments, and silicone-based or acrylic anti-foaming agents and leveling agents in an amount incapable of impairing the desired properties of the composition. It may also incorporate therein, as occasion demands, a known and popularly used antioxidant for preventing the electroconductive metal powder from oxidation, a thermal polymerization inhibitor for improving the thermal stability during storage, and fine particles of metallic oxide, silicon oxide, or boric oxide as a binding component with the substrate during the calcining work.

The photocurable composition of the present invention can be used in the form of electroconductive paste, glass paste, or fluorescent paste as described above. It may be otherwise used in the form of a film. When the paste is used in its unmodified form, it is applied to a varying substrate of glass sheet or ceramic sheet by a suitable method such as screen printing method, curtain coating method, roll coating method, bar coating method, blade coating method, or die coating method. The applied layer of the paste is then dried with a hot air circulation type drying oven or a far infrared drying oven at a temperature in the approximate range of 60° to 120° C. for a period in the approximate range of 5 to 40 minutes, for example, to produce a tack-free coating film. Then, this film is subjected to selective exposure to light, development, and calcining to give rise to a conductor pattern, a vitreous dielectric pattern, or a fluorescent pattern as requested.

The step of exposure can be accomplished by using a negative photomask containing a prescribed exposure pattern which is in contact with the dried layer (contact exposure) or out of contact with that layer (noncontact exposure). In terms of resolution, the contact exposure is preferred to the noncontact exposure. The exposure is preferred to be performed in the atmosphere of vacuum or nitrogen gas. The light sources which are usable for the exposure include a halogen lamp, a high-pressure mercury-vapor lamp, a laser beam, a metal halide lamp, a black lamp, and an electrodeless discharge lamp, for example. A preferred irradiation dose is in the approximate rage of 50 to 1,000 mJ/cm$^2$.

For the step of development, the spray method or the immersion method is used. As a developing solution, the aqueous solutions of such alkali metals as sodium hydroxide, potassium hydroxide, sodium carbonate, potassium carbonate, and sodium silicate and the aqueous solutions of amines such as monoethanolamine, diethanolamine, and triethanolamine can be used advantageously. A particularly advantageous developing solution is a dilute alkaline aqueous solution having a concentration not more than about 1.5% by weight. The developing solution is only required to saponify the carboxyl groups of the alkali-soluble macromolecular binder in the composition and permit removal of the uncured areas (unexposed areas) and, therefore, is not required to be limited to those examples cited above. After the step of development, the developed layer is preferred to be washed with water or neutralized with an acid for the removal of the unwanted residual developing solution.

At the calcining step, the substrate which has undergone the development is heat-treated in the air or an atmosphere of nitrogen at a temperature in the approximate range of 380° to 600° C. to melt the glass component and fix a required pattern such as the conductor pattern, vitreous dielectric pattern, and fluorescent pattern to the substrate. At this time, the step of calcining is preferred to be preceded by a step of heating the substrate to a temperature in the approximate range of 300° to 500° C. and keeping it at this temperature for a prescribed period thereby depriving the substrate of organic substances.

Now, the present invention will be described more specifically below by reference to working examples and comparative examples. Wherever "parts" and "%" are mentioned therein, they are based invariably on weight unless otherwise specified.

SYNTHETIC EXAMPLE 1

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing methacrylic acid and methyl methacrylate at a molar ratio indicated in Table 1 added dropwise thereto over a period of about two hours were stirred together for one hour, and the resultant mixture was inactivated by being heated to 115° C. to obtain a resin solution.

This resin solution was cooled and then subjected to an addition reaction with butyl glycidyl ether at a molar ratio indicated in Table 1 in an equivalent weight to the carboxyl groups of the resin in the presence of tetrabutylammonium bromide as a catalyst under the conditions of 95–105° C. and 30 hours. The resultant resin solution was cooled.

Further, tetrahydrophthalic anhydride was added to the resin solution and subjected to an addition reaction to the OH groups of the produced resin at a molar ratio indicated in Table 1 under the conditions of 95–105° C. and 8 hours. The product of the addition reaction was cooled and extracted from the reaction system to obtain a resin solution A having a solids content of 50%.

SYNTHETIC EXAMPLE 2

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing methacrylic acid and methyl methacrylate at a molar ratio indicated in Table 1 added dropwise thereto over a period of about two hours were stirred together for one hour, and the resultant mixture was inactivated by being heated to 115° C. to obtain a resin solution.

This resin solution was cooled and then subjected to an addition reaction with 2-ethylhexyl glycidyl ether at a molar ratio indicated in Table 1 in an equivalent weight to the carboxyl groups of the resin in the presence of tetrabutylammonium bromide as a catalyst under the conditions of 95–105° C. and 30 hours. The resultant resin solution was cooled.

Further, tetrahydrophthalic anhydride was added to the resin solution and subjected to an addition reaction to the OH groups of the produced resin at a molar ratio indicated in Table 1 under the conditions of 95–105° C. and 8 hours. The product of the addition reaction was cooled and extracted from the reaction system to obtain a resin solution B having a solids content of 50%.

SYNTHETIC EXAMPLE 3

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing methacrylic acid, methyl methacrylate and 2-hydroxyethyl methacrylate at a molar ratio indicated in Table 1 added dropwise thereto over a period of about two hours were stirred together for one hour, and the resultant mixture was inactivated by being heated to 115° C. to obtain a resin solution.

This resin solution was cooled and then subjected to an addition reaction with 2-ethylhexyl glycidyl ether at a molar ratio indicated in Table 1 in an equivalent weight to the carboxyl groups of the resin in the presence of tetrabutylammonium bromide as a catalyst under the conditions of 95–105° C. and 30 hours. The resultant resin solution was cooled.

Further, tetrahydrophthalic anhydride was added to the resin solution and subjected to an addition reaction to the OH groups of the produced resin at a molar ratio indicated in Table 1 under the conditions of 95–105° C. and 8 hours. The product of the addition reaction was cooled and extracted from the reaction system to obtain a resin solution C having a solids content of 50%.

Comparative Synthetic Example 1

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing methacrylic acid, ethyl methacrylate, and 2-hydroxyethyl methacrylate at a molar ratio indicated in Table 2 added dropwise thereto over a period of about two hours were stirred together for one hour, and the resultant mixture was inactivated by being heated to 115° C. to obtain a resin solution D having a solids content of 50%.

Comparative Synthetic Example 2

In a flask provided with a thermometer, a stirrer, a dropping funnel, and a reflux condenser, diethylene glycol monoethyl ether acetate as a solvent and azobisisobutyronitrile as a catalyst were placed and heated together in an atmosphere of nitrogen at 80° C., the hot solution consequently formed and a monomer mixture containing ethyl methacrylate and 2-hydroxyethyl methacrylate at a molar ratio indicated in Table 2 added dropwise thereto over a period of about two hours were stirred together for one hour, and the resultant mixture was inactivated by being heated to 115° C. to obtain a resin solution.

This resin solution was cooled. Then tetrahydrophthalic anhydride was added to the resin solution and subjected to an addition reaction to the OH groups of the produced resin at a molar ratio indicated in Table 2 in the presence of tetrabutylammonium bromide as a catalyst under the conditions of 95–105° C. and 8 hours to obtain a resin solution E having a solids content of 50%.

The components and the properties of the resins obtained in Synthetic Examples 1–3 and Comparative Synthetic Examples 1 and 2 are shown in Table 1 and Table 2.

In the tables, MA stands for methacrylic acid, MMA for methyl methacrylate, HEMA for 2-hydroxyethyl methacrylate, BGE for butyl glycidyl ether, EHGE for 2-ethylhexyl glycidyl ether, THPA for tetrahydrophthalic anhydride, and EMA for ethyl methacrylate. The produced resins were measured for weight-average molecular weight by the use of a high-speed system of liquid chromatography formed by connecting three columns (made by Showa Denko K.K. and sold under the registered trademark designations of "Shodex" KF-804, KF-603, and KF-802) to a pump (made by Shimadzu Seisakusho Ltd. and sold under the product code of "LC-6AD").

TABLE 1

| Components and Properties | Synthetic Example 1 (Resin A) | Synthetic Example 2 (Resin B) | Synthetic Example 3 (Resin C) |
|---|---|---|---|
| Molar ratio of MA | 0.40 | 0.40 | 0.25 |
| Molar ratio of MMA | 0.60 | 0.60 | 0.60 |
| Molar ratio of HEMA | — | — | 0.15 |
| Molar ratio of BGE | 0.40 | — | 0.25 |
| Molar ratio of EHGE | — | 0.40 | — |
| Molar ratio of THPA | 0.26 | 0.26 | 0.25 |
| Weight-average molar weight, Mw | 35,000 | 35,000 | 35,000 |
| Acid value (mg KOH/g) | 78.1 | 71.2 | 83.9 |

TABLE 2

| Components and Properties | Comparative Synthetic Example 1 (Resin D) | Comparative Synthetic Example 2 (Resin E) |
|---|---|---|
| Molar ratio of EMA | 0.67 | 0.4 |
| Molar ratio of MA | 0.15 | — |
| Molar ratio of HEMA | 0.18 | 0.6 |
| Molar ratio of THPA | — | 0.2 |
| Weight-average molar weight, Mw | 20,000 | 20,000 |
| Acid value (mg KOH/g) | 78 | 73 |

Photocurable paste compositions were prepared by using the resins obtained in Synthetic Examples and Comparative Synthetic Examples mentioned above, compounding them respectively with other components at percentage compositions which will be described herein below, stirring the resultant compositions, kneading the resultant mixtures by the use of a three-roll mill, and reducing them to a constitution of paste.

The glass frit used in these experiments had a composition of 60% of PbO, 20% of $B_2O_3$, 15% of $SiO_2$, and 5% of $Al_2O_3$, a thermal expansion coefficient, $\alpha_{300}$, of $70 \times 10^{-7}$/° C., a glass transition temperature of 445° C., and an average particle diameter of 2.5 $\mu$m. The black pigment used herein was a Cu—Cr—Mn system oxide having an average particle diameter of 0.5 $\mu$m. The electroconductive metal powder used herein was a powder of silver spheres having an average particle diameter of 1 $\mu$m and prepared for use by a treatment using a fatty acid-based surface-treating agent. The surface treatment with the fatty acid was performed by adding 400 wt.% of the silver powder into a solution of 1 wt.% of linoleic acid in a mixed solution consisting of water and isopropanol at a ratio of 1:1, stirring them together, distilling the resultant mixture thereby expelling the solvent by evaporation, and heating the residue at 70° C. for three hours.

Composition Example 1

| | |
|---|---|
| Resin solution A | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |

Composition Example 2

| | |
|---|---|
| Resin solution A | 200 parts |
| Trimethylolpropane triacrylate | 50 parts |
| 2-Benzyl-2-dimethylamino-1-(4-morpholinophenyl)-butan-1-one | 15 parts |
| Silver powder | 150 parts |
| Black pigment | 100 parts |
| Glass frit | 25 parts |

Composition Example 3

| | |
|---|---|
| Resin solution B | 200 parts |
| Pentaerythritol triacrylate | 70 parts |
| 2-Benzyl-2-dimethylamino-1-(4-morpholinophenyl)-butan-1-one | 10 parts |
| Black pigment | 150 parts |
| Glass frit | 500 parts |

Composition Example 4

| | |
|---|---|
| Resin solution C | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |

Comparative Composition Example 1

| | |
|---|---|
| Resin solution D | 200 parts |
| Pentaerythritol triacrylate | 50 parts |
| 2-Benzyl-2-dimethylamino-1-(4-morpholinophenyl)-butan-1-one | 10 parts |
| Black pigment | 150 parts |
| Glass frit | 500 parts |

Comparative Composition Example 2

| | |
|---|---|
| Resin solution D | 200 parts |
| Trimethylolpropane triacrylate | 50 parts |
| 2-Benzyl-2-dimethylamino-1-(4-morpholinophenyl)-butan-1-one | 15 parts |
| Silver powder | 150 parts |
| Black pigment | 100 parts |
| Glass frit | 25 parts |

Comparative Composition Example 3

| | |
|---|---|
| Resin solution E | 200 parts |
| Pentaerythritol triacrylate | 70 parts |
| 2-Benzyl-2-dimethylamino-1-(4-morpholinophenyl)-butan-1-one | 10 parts |
| Black pigment | 150 parts |
| Glass frit | 500 parts |

The photocurable paste compositions of Composition Examples 1–4 and Comparative Composition Examples 1–3 were stored at 25° C. and rated for storage stability (viscosity stability after 24 hours' and one week's standing).

Stripes of lines were formed of the photocurable paste compositions of Composition Examples 1–4 and Comparative Composition Examples 1–3 each on a glass substrate and rated for developing properties (by direct visual observation of the substrates after the development and visual observation of the light passed through the substrate from behind) and the lines which had undergone the calcining were rated for retention of shape.

The formation of the striped pattern of lines was performed by the following procedure. For a start, a given composition one–three hours old or one week old from the time of preparation was applied to the entire surface of a glass substrate through a 300-mesh polyester screen. Then, by the use of a negative film having a striped pattern adapted to form a line width of 100 $\mu$m and a space width of 100 $\mu$m, the applied layer of the composition was exposed to the light emitted from a metal halide lamp so as to amount to an exposed dose of 500 mJ/cm$^2$ accumulated on the composition. Thereafter, the exposed film was developed with an aqueous $Na_2CO_3$ solution kept at a temperature of 30° C. and then rinsed with water. Finally, the developed film was placed in an electric oven and calcined in the air. The calcining was carried out by a process which comprised elevating the temperature from the room temperature to 450° C. at a rate of temperature increase of 5° C./minute, keeping the temperature at 450° C. for 30 minutes, thereafter elevating the temperature to 550° C. at a rate of temperature increase of 5° C./minute, keeping the temperature at this level for 30 minutes to calcine the film, and subsequently allowing the hot film to cool off to room temperature.

The substrates consequently obtained were tested for various properties and the results of the test were rated. The results of the rating are shown in Table 3.

TABLE 3

| Properties | | Composition Examples | | | | Comparative Composition Examples | | |
|---|---|---|---|---|---|---|---|---|
| | | 1 | 2 | 3 | 4 | 1 | 2 | 3 |
| Storage stability | After 24 hours | ○ | ○ | ○ | ○ | Δ | Δ | X |
| | After one week | Δ | ○ | ○ | Δ | X | X | X |
| Developing properties | After 1–3 hours | ○ | ○ | ○ | ○ | ○ | ○ | ○ |
| | After one week | ○ | ○ | ○ | ○ | Δ | Δ | X |
| Shape of lines after calcination | After 1–3 hours | ○ | ○ | ○ | ○ | ○ | ○ | ○ |
| | After one week | ○ | ○ | ○ | ○ | Δ | Δ | —*) |
| Remark | *)The sample bearing the mark "X" for developing properties was in such a state as to defy all efforts to perform rating. | | | | | | | |

The following properties indicated in Table 3 were rated on the following scales.

Storage stability:
  ○: Less than 10% of increase in viscosity
  Δ: Not less than 10% and less than 30% of increase in viscosity
  X: Not less than 30% of increase in viscosity Developing properties:
  ○: Stable survival of lines and absence of residual paste in the space part
  Δ: Separation of less than 10% of the whole of lines or presence of slight residue of paste between lines after the development
  X: Separation of not less than 10% of the whole of lines or presence of clear residue of paste (opaque in observation with the light of transmission) between lines after the development Shape of lines after calcining;
  ○: Absence of warp or separation in cross section of stripe pattern
  Δ: Presence of slight warp in cross section of stripe pattern and separation of less than 10%

X: Presence of clear warp in cross section of stripe pattern and separation of not less than 10%

| Composition Example 5 | |
|---|---|
| Resin solution A | 200 parts |
| Pentaerythritol triacrylate | 50 parts |
| 2-Benzyl-2-dimethylamino-1-(4-morpholinophenyl)-butan-1-one | 10 parts |
| 2-methacryloyloxyethyl acid phosphate | 5 parts |
| Black pigment | 150 parts |
| Glass frit | 500 parts |
| Composition Example 6 | |
| Resin solution B | 200 parts |
| Pentaerythritol triacrylate | 70 parts |
| 2-Benzyl-2-dimethylamino-1-(4-morpholinophenyl)-butan-1-one | 10 parts |
| 2-methacryloyloxyethyl acid phosphate | 5 parts |
| Black pigment | 150 parts |
| Glass frit | 500 parts |

The photocurable paste compositions of Composition Examples 5 and 6 were stored at 25° C. and rated for storage stability (viscosity stability after one week's and two weeks' standing) in the same way as mentioned above. The results of the rating are shown in Table 4.

TABLE 4

| Storage | Composition Examples | |
|---|---|---|
| stability | 5 | 6 |
| After one week | ○ | ○ |
| After two weeks | ○ | ○ |

It will be clear from the results shown in Table 4 that the storage stability of the composition of the present invention is further improved by the addition of a stabilizer thereto.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and the range of equivalency of the claims are, therefore, intended to be embraced therein.

The disclosure in Japanese Patent Application No. 11-197791 of Jul. 12, 1999 is incorporated here by reference. This Japanese Patent Application describes the invention described hereinabove and claimed in the claims appended hereinbelow and provides the basis for a claim of priority for the instant invention under 35 U.S.C. 119.

What is claimed is:

1. An alkali development type photocurable composition, comprising in combination:

(A) an alkali-soluble macromolecular binder having a weight-average molecular weight in the range of 5,000 to 100,000 and an acid value in the range of 50 to 150 mg KOH/g, possessing no ethylenically unsaturated double bond, and obtained by causing (d) a compound possessing one glycidyl group and no ethylenically unsaturated double bond in its molecule to react with a carboxyl group of (A-1) a copolymer of (a) an ethylenically unsaturated bond-containing compound possessing one carboxyl group in its molecule with (b) an ethylenically unsaturated bond-containing compound possessing neither hydroxyl group nor acidic group in its molecule, the copolymer possessing no glycidyl group, or a carboxyl group of (A-2) a copolymer of (a) an ethylenically unsaturated bond-containing compound possessing one carboxyl group in its molecule with (b) an ethylenically unsaturated bond-containing compound possessing neither hydroxyl group nor acidic group in its molecule and (c) an ethylenically unsaturated bond-containing compound possessing a hydroxyl group, the copolymer possessing no glycidyl group, and then causing (e) a polybasic acid anhydride to react with a secondary hydroxyl group caused by the above reaction and a primary hydroxyl group of the copolymer (A-2), (B) an inorganic powder, (C) a photopolymerizable monomer, (D) a photopolymerization initiator, and (E) an organic solvent.

2. The composition according to claim 1, further comprising (F) a stabilizer.

3. The composition according to claim 1, wherein said inorganic powder (B) incorporates therein a low melting glass frit in an amount accounting for a portion of not less than 5% by weight thereof.

4. The composition according to claim 3, wherein said low melting glass frit is selected from the group consisting of:

an amorphous frit which contains lead oxide as a main component and has a composition (in percent by weight of oxide basis) 48–82% of PbO, 0.5–22% of $B_2O_3$, 3–32% of $SiO_2$, 0–12% of $Al_2O_3$, 0–10% of BaO, 0–15% of ZnO, 0–2.5% of $TiO_2$, and 0–25% of $Bi_2O_3$ and has a softening point in the range of 420–590° C., an amorphous frit which contains bismuth oxide as a main component and has a composition (in percent by weight of oxide basis) 35–88% of $Bi_2O_3$, 5–30% of $B_2O_3$, 0–20% of $SiO_2$, 0–5% of $Al_2O_3$, 1–25% of BaO, and 1–20% of ZnO and has a softening point in the range of 420–590° C., an amorphous frit which contains zinc oxide as a main component and has a composition of (in percent by weight of oxide basis) 25–60% of ZnO, 2–15% of $K_2O$, 25–45% of $B_2O_3$, 1–7% of $SiO_2$, 0–10% of $Al_2O_3$, 0–20% of BaO, and 0–10% of MgO and has a softening point in the range of 420–590° C., and an amorphous frit which contains lithium oxide as a main component and has a composition of (in percent by weight of oxide basis) 1–13% of $Li_2O$, 0–30% of $Bi_2O_3$, 1–50% of $B_2O_3$, 1–50% of $SiO_2$, 1–40% of $Al_2O_3$, 1–20% of BaO, and 1–25% of ZnO and has a softening point in the range of 420–590° C.

5. The composition according to claim 1, wherein said inorganic powder (B) contains at least one member selected from the group consisting of a metal powder, a glass powder, a black pigment, and ceramic fine particles.

6. The composition according to claim 1, wherein said inorganic powder (B) contains a black pigment formed of a metal oxide containing at least one element selected from the group consisting of Fe, Co, Cu, Cr, Mn, and Al as a main component thereof and/or an electroconductive metal powder or electroconductive fine black particles containing at least one element selected from the group consisting of Ag, Au, Pd, Ni, Ru, Cu, Al, and Pt.

7. The composition according to claim 1, wherein said inorganic powder (B) contains at least one ceramic selected from the group consisting of alumina, cordierite, and zircon.

8. The composition according to claim 2, wherein said stabilizer (F) is at least one compound selected from the group consisting of inorganic acids, organic acids, inorganic phosphoric acids, and organic phosphoric acids.

9. The composition according to claim 3, wherein said glass frit has an average particle diameter of not more than 10 μm and is present in an amount of 25 to 1,000 parts by weight, based on 100 parts by weight of said alkali-soluble macromolecular binder (A).

10. The composition according to claim 6, wherein said electroconductive metal powder has an average particle diameter of not more than 10 μm and is present in an amount of 25 to 1,000 parts by weight, based on 100 parts by weight of said alkali-soluble macromolecular binder (A).

11. The composition according to claim 1, wherein said photopolymerizable monomer (C) is present in an amount of 1 to 200 parts by weight, based on 100 parts by weight of said alkali-soluble macromolecular binder (A).

12. The composition according to claim 1, wherein said photopolymerization initiator (D) is present in an amount of 1 to 20 parts by weight, based on 100 parts by weight of said alkali-soluble macromolecular binder (A).

13. The composition according to claim 2, wherein said stabilizer (F) is present in an amount of not more than 5 parts by weight, based on 100 parts by weight of said inorganic powder (B).

14. The composition according to claim 1, which is in the form of paste.

15. The composition according to claim 1, which is formed in the form of film.

16. A calcined pattern obtained by patterning a film of the alkali development type photocurable composition according to claim 1 formed in close adhesion on a substrate and then calcining the patterned film.

* * * * *